United States Patent

Lyu et al.

(10) Patent No.: US 7,741,644 B2
(45) Date of Patent: Jun. 22, 2010

(54) SEMICONDUCTOR DEVICE HAVING STACKED TRANSISTORS

(75) Inventors: Gyu-Ho Lyu, Gyeonggi-do (KR);
Seug-Gyu Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 385 days.

(21) Appl. No.: 11/672,875

(22) Filed: Feb. 8, 2007

(65) Prior Publication Data

US 2007/0181953 A1 Aug. 9, 2007

(30) Foreign Application Priority Data

Feb. 8, 2006 (KR) .................. 10-2006-0012179

(51) Int. Cl.
*H01L 27/088* (2006.01)
(52) U.S. Cl. .......... 257/67; 257/E21.614; 257/E21.575; 257/E27.026
(58) Field of Classification Search .......... 257/E21.507, 257/E21.614, E21.575, E27.026
See application file for complete search history.

(56) References Cited

U.S. PATENT DOCUMENTS

| | | | | |
|---|---|---|---|---|
| 4,272,880 A | * | 6/1981 | Pashley | 438/153 |
| 5,612,552 A | * | 3/1997 | Owens | 257/202 |
| 6,429,070 B1 | * | 8/2002 | Gonzalez et al. | 438/253 |
| 6,429,484 B1 | | 8/2002 | Yu | |
| 6,882,010 B2 | | 4/2005 | Bhattacharyya | |
| 2002/0119640 A1 | * | 8/2002 | Gonzalez | 438/455 |
| 2005/0248035 A1 | * | 11/2005 | Son et al. | 257/758 |
| 2006/0102959 A1 | * | 5/2006 | Kim et al. | 257/369 |
| 2006/0115944 A1 | * | 6/2006 | Kwak et al. | 438/199 |
| 2006/0237725 A1 | * | 10/2006 | Jeong et al. | 257/66 |
| 2007/0181957 A1 | * | 8/2007 | Kim et al. | 257/393 |
| 2007/0215906 A1 | * | 9/2007 | Wu et al. | 257/204 |

FOREIGN PATENT DOCUMENTS

| | | |
|---|---|---|
| KR | 10-0214558 | 5/1999 |
| KR | 2001-0106418 | 11/2001 |

OTHER PUBLICATIONS

English language abstract of Korean Publication No. 10-0214558.

* cited by examiner

*Primary Examiner*—Lynne A Gurley
*Assistant Examiner*—Colleen A Matthews
(74) *Attorney, Agent, or Firm*—Myers Bigel Sibley & Sajovec, PA (57) ABSTRACT

A semiconductor device includes a first semiconductor layer, a first interlayer insulation layer, a second semiconductor layer, and a gate pattern. The first interlayer insulation layer covers the first semiconductor layer. The second semiconductor layer is formed on the first interlayer insulation layer and includes source regions, drain regions, and a channel region interposed between the source region and the drain region. The gate pattern includes a gate insulation layer on the channel region of the second semiconductor layer. At least one of the source regions and the drain regions includes an elevated layer having a top surface higher than that of the channel region.

13 Claims, 7 Drawing Sheets

Fig. 1

(CONVENTIONAL ART)

SEMICONDUCTOR DEVICE HAVING STACKED TRANSISTORS

CROSS-REFERENCE TO RELATED APPLICATIONS

This patent application claims the benefit of foreign priority to Korean Patent Application No. 10-2006-0012179, filed on Feb. 8, 2006, the entire contents of which are hereby incorporated by reference.

BACKGROUND

1. Field of Invention

Embodiments disclosed herein relate generally to semiconductor devices and, more particularly, to a semiconductor device having stacked transistors and a method of forming the same.

2. Description of the Related Art

Most recent electronic appliances include semiconductor devices that include electronic elements such as a transistor, a resistor, and a capacitor. The electronic elements are designed and manufactured to perform expected functions and are then integrated together on a semiconductor substrate. For example, the electronic appliances such as a computer and a digital camera include semiconductor devices such as a memory chip for storing information and a processing chip for controlling information. The memory chip and the processing chip include electronic elements integrated on a semiconductor substrate.

On the other hand, semiconductor devices need to be more highly integrated to satisfy consumers with an excellent performance and a reasonable price. Conventionally, electronic elements constituting a semiconductor device are miniaturized to achieve high integration. However, because of various technical limitations in semiconductor device manufacturing processes, a developing speed of miniaturizing the electronic elements is under certain restriction. Accordingly, a new semiconductor device manufacturing method for overcoming the miniaturization limitation is required to achieve the desired integration of the semiconductor device.

Figure 1:
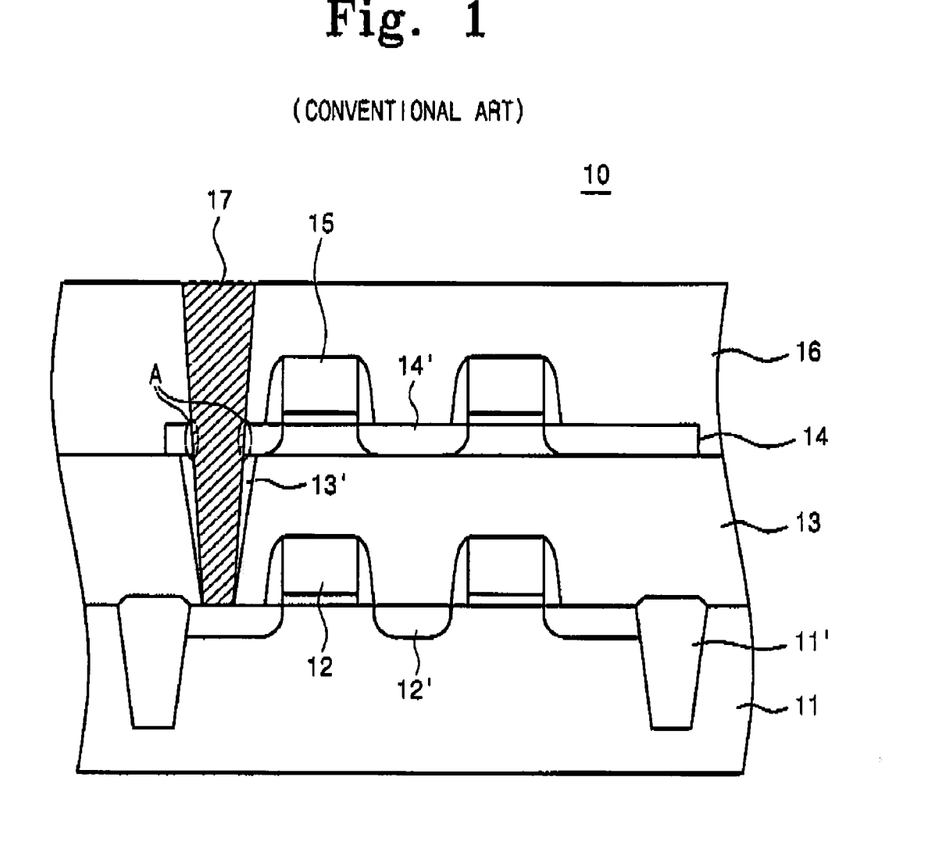
FIG. 1 is a sectional view of a conventional semiconductor device having stacked transistors.

Lately, as a corresponding method of manufacturing a highly integrated semiconductor device, there is provided a method of stacking transistors in a plurality of layers. FIG. 1 is a sectional view of a conventional semiconductor device having stacked transistors.

Referring to FIG. 1, a conventional semiconductor device 10 includes a plurality of first transistors 12 on a semiconductor substrate 11 having a device isolation layer 11'. The first transistor 12 includes source/drain regions 12'. A first interlayer insulation layer 13 covers the first transistors 12 on the semiconductor substrate 11. A semiconductor layer 14 formed from a seed plug 13' is on the first interlayer insulation layer 13. Second transistors 15 are provided on the semiconductor layer 14, and a second interlayer insulation layer 16 is provided on the second transistors 15. The second transistor 15 includes source/drain regions 14'. A conducting column 17 penetrates the source/drain regions 14' of the semiconductor layer 14 and the second and first interlayer insulation layers 16 and 13 to contact the semiconductor substrate 11. The semiconductor substrate 11 is electrically connected to the second transistors 15 via the semiconductor layer 14 and the conducting column 17.

Typically, the semiconductor layer 14 is thinly formed to reduce a leakage current of the second transistors 15. However, when the semiconductor layer 14 is thin, a contact area "A" between the conducting column 17 and the source/drain regions 14' of the semiconductor layer 14 decreases. Therefore, contact resistance increases and semiconductor device characters deteriorate.

SUMMARY

Embodiments exemplary described herein provide a highly integrated semiconductor device having improved electric characteristics. Embodiments exemplary described also provide a method of forming a semiconductor device to overcome a technical limitation for miniaturization and increase the degree of integration.

One embodiment described herein can be exemplarily characterized as a semiconductor device that includes a first semiconductor layer; a first interlayer insulation layer covering the first semiconductor layer; a second semiconductor layer on the first interlayer insulation layer, the second semiconductor layer comprising a source region, a drain region and a channel region interposed between the source and drain regions; and a gate pattern on the channel region, wherein at least one of the source and drain regions comprises an elevated layer, wherein a top surface of the elevated layer is above a top surface of the channel region.

Another embodiment described herein can be exemplarily characterized as a method of forming a semiconductor device that includes forming a first interlayer insulation layer covering a first semiconductor layer; forming a second semiconductor layer on the first interlayer insulation layer; forming a source region, a drain region and a channel region interposed between the source and drain regions within the second semiconductor layer; forming a gate pattern on the channel region; and forming an elevated layer on at least one of the source and drain regions, wherein a top surface of the elevated layer is above a top surface of the channel region.

BRIEF DESCRIPTION OF THE FIGURES

Non-limiting and non-exhaustive embodiments will be described with reference to the following figures, wherein like reference numerals refer to like parts throughout the various figures unless otherwise specified. In the figures.

DETAILED DESCRIPTION

Exemplary embodiments will be described below in more detail with reference to the accompanying drawings. These embodiments may, however, be realized in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2:
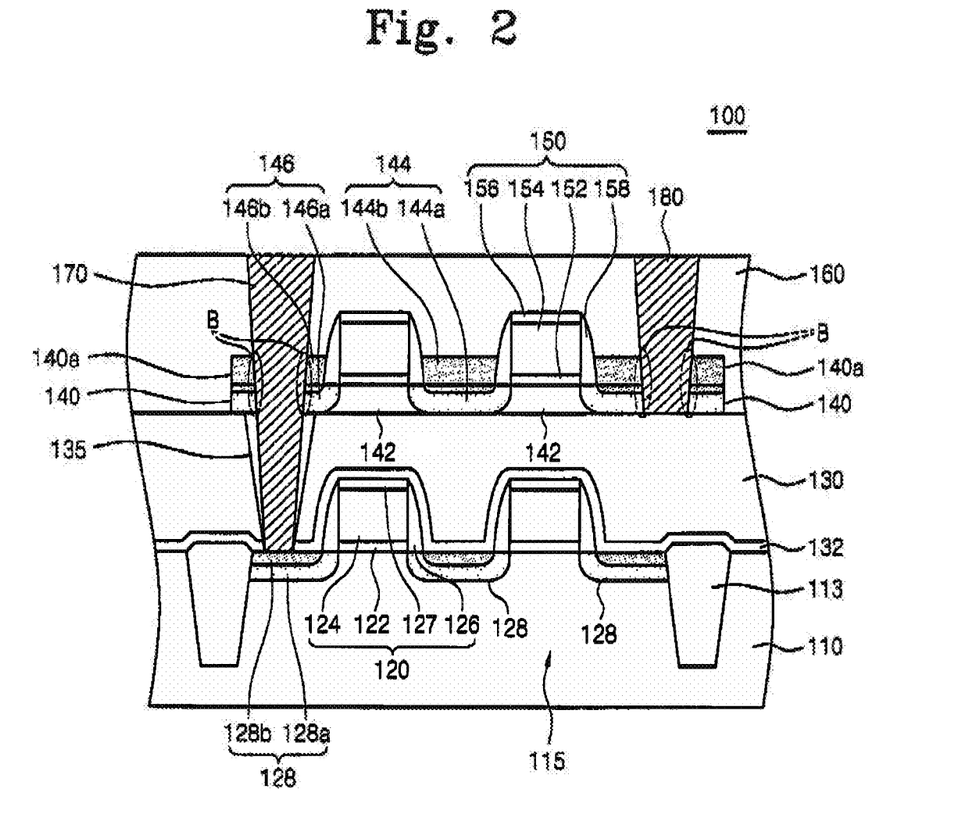
FIG. 2 is a sectional view of one embodiment of a semiconductor device having stacked transistors.

FIG. 2 is a sectional view of one embodiment of a semiconductor device 100 having stacked transistors.

Referring to FIG. 2, the semiconductor device 100 is formed on a first semiconductor layer 110 having an active region 115 that is divided by a device isolation layer 113. The first semiconductor layer 110 may be a single crystal semiconductor substrate, or a silicon-on-insulator (SOI) substrate having a semiconductor layer that is formed interposing an insulation layer therebetween. The first semiconductor layer 110 may contain a first conductivity-type impurity (e.g., p-type impurity ions). A plurality of first transistors 120 may be disposed on the first semiconductor layer 110. The first transistor 120 includes a gate insulation layer 122, a gate electrode pattern 124, a capping pattern 127, and a first sidewall spacer 126. The gate insulation layer 122 may include a material such as, for example, thermal silicon oxide and the gate electrode pattern 124 may include a material such as, for example, polysilicon containing a second conductivity-type impurity (e.g., n-type impurity ions) opposite to the first conductivity-type impurity. The capping pattern 127 may include a material such as, for example, silicon oxide or silicon nitride. The first sidewall spacer 126 may include a material such as, for example, silicon oxide. Impurity regions 128 for source and drain regions are disposed on both sides of the gate electrode pattern 124. The impurity regions 128 may contain the second conductivity-type impurity (e.g., n-type impurity ions) opposite to the first conductivity-type impurity. The impurity regions 128 may be include a low-concentration impurity region 128a and a high-concentration impurity region 128b over the low-concentration impurity region 128a.

A first interlayer insulation layer 130 covers the first transistors 120 on the first semiconductor layer 110. The first interlayer insulation layer 130 include a material such as, for example, silicon oxide. An etch stop layer 132 may additionally be formed under the first interlayer insulation layer 130 to, for example, prevent the first semiconductor layer 110 from being damaged during a subsequent etching process for contact hole formation. The etch stop layer 132 may include an insulation material having a lower etch rate than that of the first interlayer insulation layer 110 such as, for example, silicon nitride or silicon oxide nitride.

A second semiconductor layer 140 is provided on the first interlayer insulation layer 130. The second semiconductor layer 140 includes source/drain regions 144 and 146, and a channel region 142 interposed between the source region 144 and the drain region 146. An epitaxial seed plug 135 is disposed between the first semiconductor layer 110 and the second semiconductor layer 140 to penetrate the first interlayer insulation layer 130. The epitaxial seed plug 135 may be grown from the single-crystal first semiconductor layer 110 using a selective epitaxial growth (SEG) method and may include silicon doped with the second conductivity-type impurity ions. The second semiconductor layer 140 may be epitaxially grown from the epitaxial seed plug 135, and may include a silicon layer doped with the first conductivity-type impurity ions.

Second transistors 150 are disposed on the second semiconductor layer 140. The second transistor 150 includes a gate pattern 154 having a gate insulation layer 152 interposed on the channel region 142, a capping pattern 156, and a second sidewall spacer 158. The gate insulation layer 152 may include a material such as, for example, thermal silicon oxide. The gate electrode 154 may include a material such as, for example, silicon containing the second conductivity-type (e.g., n-type impurity ions) opposite to the first conductivity-type. The capping pattern 156 may include a material such as, for example, silicon oxide or silicon nitride and the second sidewall spacer 158 may include a material such as, for example, silicon oxide. Impurity regions 144 and 146 for source/drain regions are disposed on both sides of the gate pattern 154. The impurity regions 144 and 146 may contain the second conductivity-type (e.g., n-type impurity ions). The impurity regions 144 and 146 include low-concentration impurity regions 144a and 146a, and high-concentration impurity regions 144b and 146b over the low-concentration impurity regions 144a and 146a. The low-concentration impurity regions 144a and 146a may extend to the bottom of the second semiconductor layer 140. The high-concentration impurity regions 144b and 146b may be spaced apart from the bottom portion of the second semiconductor layer 140 and may be formed to extend to the top portion of the second semiconductor layer 140. Since the high-concentration impurity regions 144b and 146b are only formed on the top portion of the second semiconductor layer 140 and do not extend to the bottom portion of the second semiconductor layer 140, shallow junctions can be achieved.

An elevated layer 140a (i.e., a first elevated layer) having a top surface that is above the channel region 142 is disposed on the top portion of at least one of the impurity regions 144 and 146. In one embodiment, the elevated layer 140a is adjacent to a second sidewall spacer 158 of the second transistor 150 and is self-aligned thereto. In one embodiment, the elevated layer 140a may be epitaxially grown from the second semiconductor layer 140 adjacent to the second sidewall spacers 158 using the SEG method. In another embodiment, the elevated layer 140a may be a portion of the high-concentration impurity region doped with impurity ions of a conductivity-type identical to that of the impurity for the source/drain regions. That is, the high-concentration impurity regions 144b and 146b may include the top portion of the second semiconductor layer 140 and the elevated layer 140a.

A second interlayer insulation layer 160 covers the second transistors 150 on the second semiconductor layer 140. A first conducting column 170 penetrates the second interlayer insulation layer 160, the elevated layer 140a, the second semiconductor layer 140, and the first interlayer insulation layer 130 and is connected to the first semiconductor layer 110. Accordingly, the first semiconductor layer 110 is electrically connected to the second semiconductor layer 140 through the first conducting column 170. The side of the first conducting column 170 contacts the elevated layer 140a and the second semiconductor layer 140. Additionally, a second conducting column 180 may penetrate the second interlayer insulation layer 160 to connect to the source region or the drain region including the elevated layer 140a. Accordingly, a lower portion of the second conducting column 180 contacts the elevated layer 140a and the second semiconductor layer 140. The first and second conducting columns 170 and 180 may include a barrier layer (e.g., a barrier metal layer) and a conductor material (e.g., a metal material) surrounded by a barrier layer. The barrier layer may include a material such as, for example, titanium or titanium nitride, and the conductor material may include a material such as, for example, tungsten.

As shown in FIG. 2, the first and second conducting columns 170 and 180 contact the elevated layer 140a and the impurity regions 144 and 146 of the second semiconductor layer 140 at the "B" regions. Due to the presence of the elevated layer 140a, the contact area at the "B" regions is greater than a contact area at the "A" region shown in FIG. 1. Accordingly, an electrical contact resistance can be reduced relative to the electrical contact resistance of the device shown in FIG. 1. Further, the leakage current of the second transistor 150 can be decreased by reducing the thickness of the second semiconductor layer 140, and thus the thickness of the channel region 142.

FIGS. 3A through 3F are sectional views illustrating an exemplary method of forming a semiconductor device having stacked transistors.

Figure 3A:
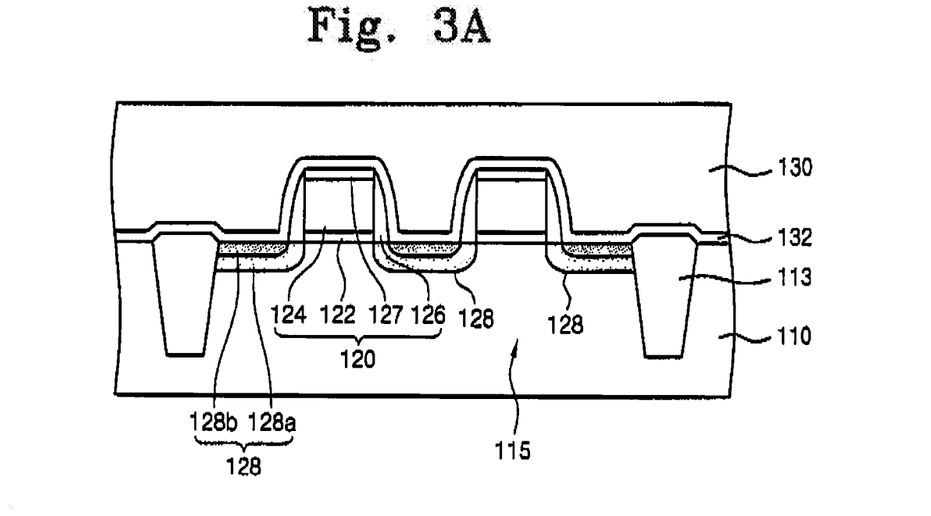
FIGS. 3A through 3F are sectional views illustrating an exemplary method of forming a semiconductor device having stacked transistors.

Referring to FIG. 3A, a device isolation layer 113 is formed on the first semiconductor layer 110, and an active region 115 is defined by the device isolation layer 113. The first semiconductor layer 110 may be a single crystal semiconductor substrate, or a SOI substrate having a semiconductor layer that is formed interposing an insulation layer on the semiconductor substrate. The first semiconductor layer 110 may contain a first conductivity-type impurity (e.g., p-type impurity ions).

A plurality of first transistors 120 are formed on the active region 115 of the first semiconductor layer 110. The first transistor 120 includes a gate insulation layer 122, a gate electrode pattern 124, a capping pattern 127, and first sidewall spacers 126. The gate insulation layer 122 is disposed on the first semiconductor layer 110 followed by the formation and patterning of a polysilicon layer (i.e., a gate conductor layer) and a capping layer such that the gate electrode pattern 124 and the capping pattern 127 are thereby formed. The polysilicon layer may contain the second conductivity-type impurity. The capping layer protects the polysilicon layer and may include a material such as, for example, silicon oxide or silicon nitride. The gate insulation layer 122 may include a material such as, for example, silicon oxide formed, for example, by subjecting the first semiconductor layer 110 to a thermal oxidation process.

Using the gate electrode pattern 124 and the capping pattern 127 as a mask, first concentration impurity ions of the second conductivity-type are implanted to form low-concentration source/drain regions 128a. Next, first sidewall spacers 126 are formed on both sidewalls of the gate electrode pattern 124 and the capping pattern 127. In one embodiment, the first sidewall spacers 126 include a silicon oxide material that has been deposited over the gate electrode pattern 124 and the capping pattern 127 and anisotropically etched. Using the gate electrode pattern 124 and the first sidewall spacer 126 as a mask, the second conductivity-type impurity ions having a second concentration higher than the first concentration are implanted to form high-concentration source/drain regions 128b on the both sides of the gate electrode pattern 124. The source/drain regions 128 include a low-concentration impurity region 128a and a high-concentration impurity region 128b formed in the low-concentration impurity region 128a.

A first interlayer insulation layer 130 is formed to cover the first transistors 120 on the first semiconductor layer 110. The first interlayer insulation layer 130 may include a material such as, for example, silicon oxide formed according to a high density plasma deposition (HDP) process, a borophosphosilicate glass (BPSG) process, or a plasma enhanced tetra-ethyl-ortho-silicate (PE-TEOS) process, and also may be planarized for transistor stacking. An etch stop layer 132 may be formed between the first interlayer insulation layer 130 and the first semiconductor layer 110. The etch stop layer 132 prevents the first semiconductor layer 110 from being damaged during a subsequent etching process for contact hole formation. The etch stop layer 132 may include an insulation material having a lower etch rate than that of the first interlayer insulation layer 110 such as, for example, silicon nitride or silicon oxide nitride.

Figure 3B:
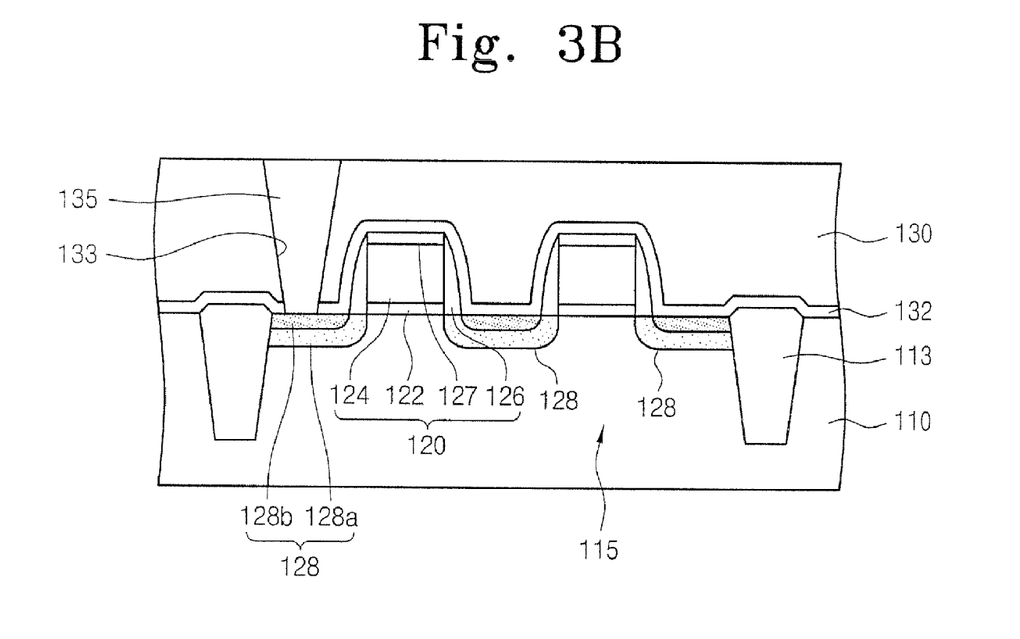

Referring to FIG. 3B, the first interlayer insulation layer 130 is patterned using a photoresist pattern (not shown) to form a seed contact hole 133 exposing a predetermined region of the first semiconductor layer 110 (e.g., a portion of a source/drain region 128). An epitaxial seed plug 135 may then be formed to fill the seed contact hole 133. The filling process may be performed according to a selective epitaxial growth (SEG) method. In an exemplary SEG method, the region of the first semiconductor layer 110 exposed by the seed contact hole 133 is used as a seed layer. Although FIG. 3B illustrates the epitaxial seed plug 135 as substantially completely filling the seed contact hole 133, it will be appreciated that the epitaxial seed plug 135 may not completely fill the seed contact hole 133. In the SEG method, a single-crystal silicon layer may be grown at approximately 800° C. using a process gas including DCS and HCl. Next, a thermal treatment process may be additionally performed to stabilize the grown single-crystal silicon layer. In the SEG method, crystal growth occurs only on the seed layer.

Figure 3C:
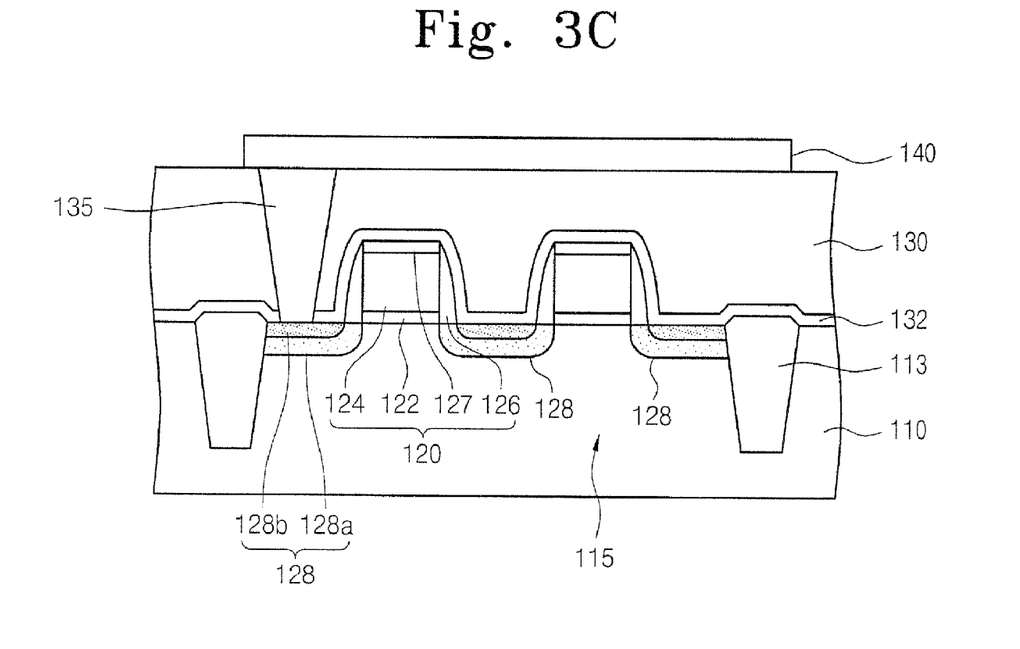

Referring to FIG. 3C, a second semiconductor layer 140 is formed on the epitaxial seed plug 135. Various methods may be employed to form the second semiconductor layer 140. In one exemplary method, a SEG process is employed to form the second semiconductor layer 140 formed using the epitaxial seed plug 135 as a seed layer. As shown, the SEG process ensures that the second semiconductor layer 140 sufficiently cover the top surface of the first interlayer insulation layer 130. The second semiconductor layer 140 is planarized using a chemical mechanical polishing (CMP) process. The second semiconductor layer 140 is patterned to have a predetermined pattern. In one embodiment, the second semiconductor layer 140 may be patterned to form a body layer having transistors.

In other embodiments, the second semiconductor layer 140 may be formed by employing various epitaxial process (other than SEG) such as solid phase epitaxy (SPE), liquid phase epitaxy (LPE), vapor phase epitaxy (VPE), or the like or combinations thereof. In the SPE process, an amorphous or polycrystalline silicon layer contacting the epitaxial seed plug 135 is formed on the first interlayer insulation layer 130 and then a crystallization process (e.g., a heat treatment process) is performed to convert the amorphous or polycrystalline silicon layer into a single-crystal silicon layer. In the LPE process, an amorphous or polycrystalline silicon layer contacting the epitaxial seed plug 135 is formed on the first interlayer insulation layer 130 and then the resulting structure is liquefied and cooled down under predetermined conditions sufficient to form a single-crystal silicon layer. In the VPE process, a single-crystal silicon layer is formed using a CVD process.

Figure 3D:
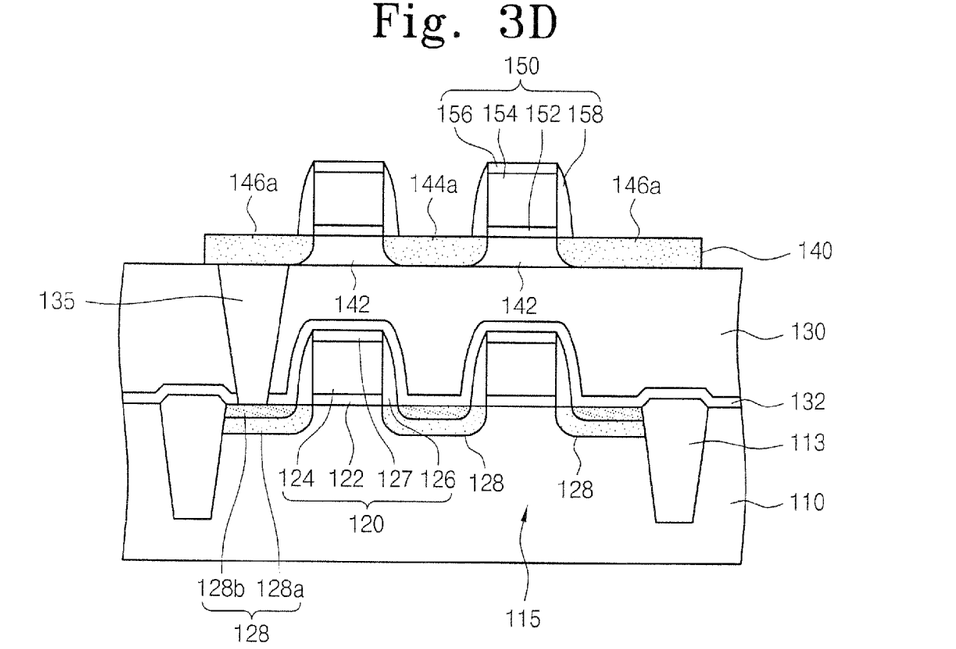

Referring to FIG. 3D, a plurality of second transistors 150 are formed on the second semiconductor layer 140. A polysilicon layer and a capping layer are formed on a channel region 142 of the second semiconductor layer 140 and patterned to form a gate pattern 154 and a capping pattern 156. The gate insulation layer 152 may be interposed between the second semiconductor layer 140 and the gate pattern 154, and be provided as a thermal oxide layer. The polysilicon layer may contain impurity ions of the second conductivity-type. The capping layer protects a polysilicon layer, and may include a material such as, for example, silicon oxide.

Using the gate pattern 154 as a mask, a first concentration of impurity ions of the second conductivity-type are implanted into the second semiconductor layer 140 to form low-concentration source/drain regions 144a and 146a. Next, second sidewall spacers 158 are formed on both sidewalls of the gate pattern 154 and the capping pattern 156. In one embodiment, the second sidewall spacers 158 include a silicon oxide material that has been deposited over the gate pattern 154 and the capping pattern 156 and anisotropically etched. A portion of the low-concentration source/drain regions 144a and 146a in the second semiconductor layer 140 is exposed. Therefore, second transistors 150 are formed to include the low-concentration source/drain regions 144a and 146a.

Figure 3E:
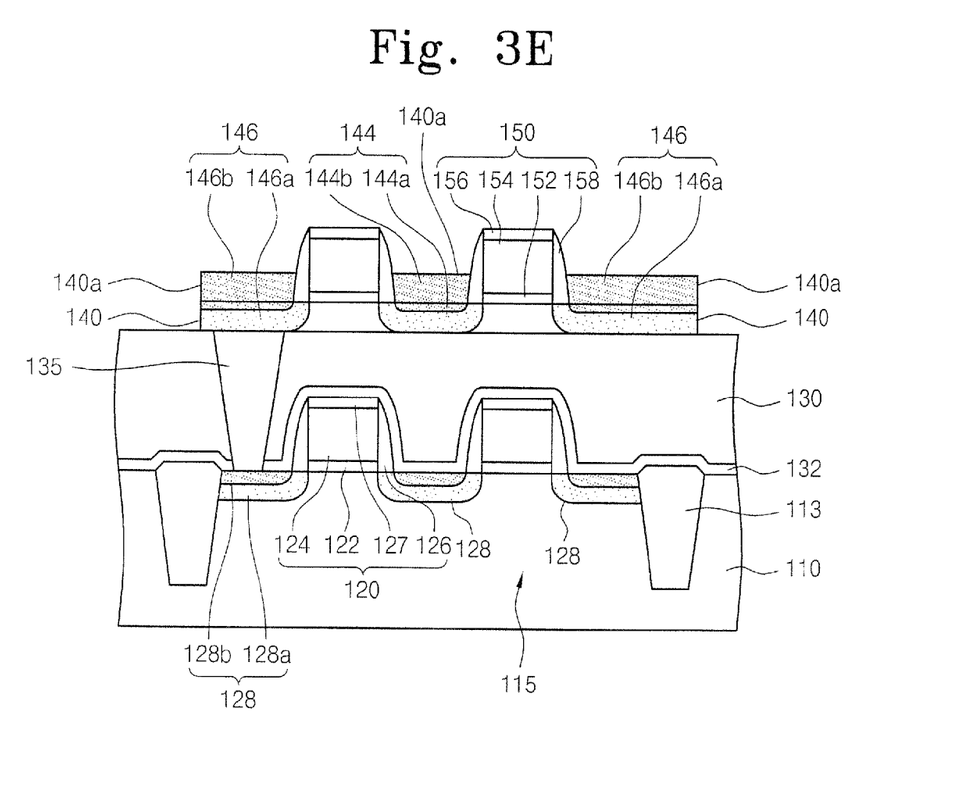

Referring to FIG. 3E, the elevated layer 140a is formed. In one embodiment, the elevated layer 140a may be provided as a semiconductor layer formed according to a SEG method in which the exposed low-concentration source/drain regions 144a and 146a of the second semiconductor layer 140 are used as a seed layer. Accordingly, a top surface of the elevated layer 140a is higher than a top surface of the channel region 142 within the second semiconductor layer 140. Moreover, the elevated layer 140a is self-aligned with respect to the second sidewall spacers 158 of the second transistor 150. Although not shown, the elevated layer 140a may be formed on only a portion of the source/drain regions 144a and 146a. For this, predetermined source/drain regions 144a and 146a can be covered by an insulation layer pattern (not shown) before forming the elevated layer 140a.

After forming the elevated layer 140a, second conductivity-type impurity ions having a higher second concentration than the first concentration are implanted into the elevated layer 140a using the second sidewall spacers 158 as a mask. Additionally, a thermal treatment process is performed to diffuse the second conductivity-type impurity ions from the elevated layer 140a into the upper portion of the second semiconductor layer 140. The high-concentration source/drain regions 144b and 146b are formed on the top portion of the second semiconductor layer 140 adjacent to the elevated layer 140a that is spaced apart from the bottom of the second semiconductor layer 140. The elevated layer 140a contains impurity ions of a conductivity-type identical to that of impurity ions for source/drain regions. Accordingly, the elevated layer 140a may be a portion of the high-concentration source/drain impurity regions 144b and 146b.

The low-concentration source/drain regions 144a and 146a may extend to the bottom of the second semiconductor layer 140. The high-concentration source/drain regions 144b and 146b, however, are spaced apart from the bottom of the second semiconductor layer 140 and extend to the top portion of the second semiconductor layer 140 and the elevated layer 140a. The high-concentration source/drain regions 144b and 146b are limited to the top portion of the second semiconductor layer 140 such that shallow junction can be realized.

Figure 3F:
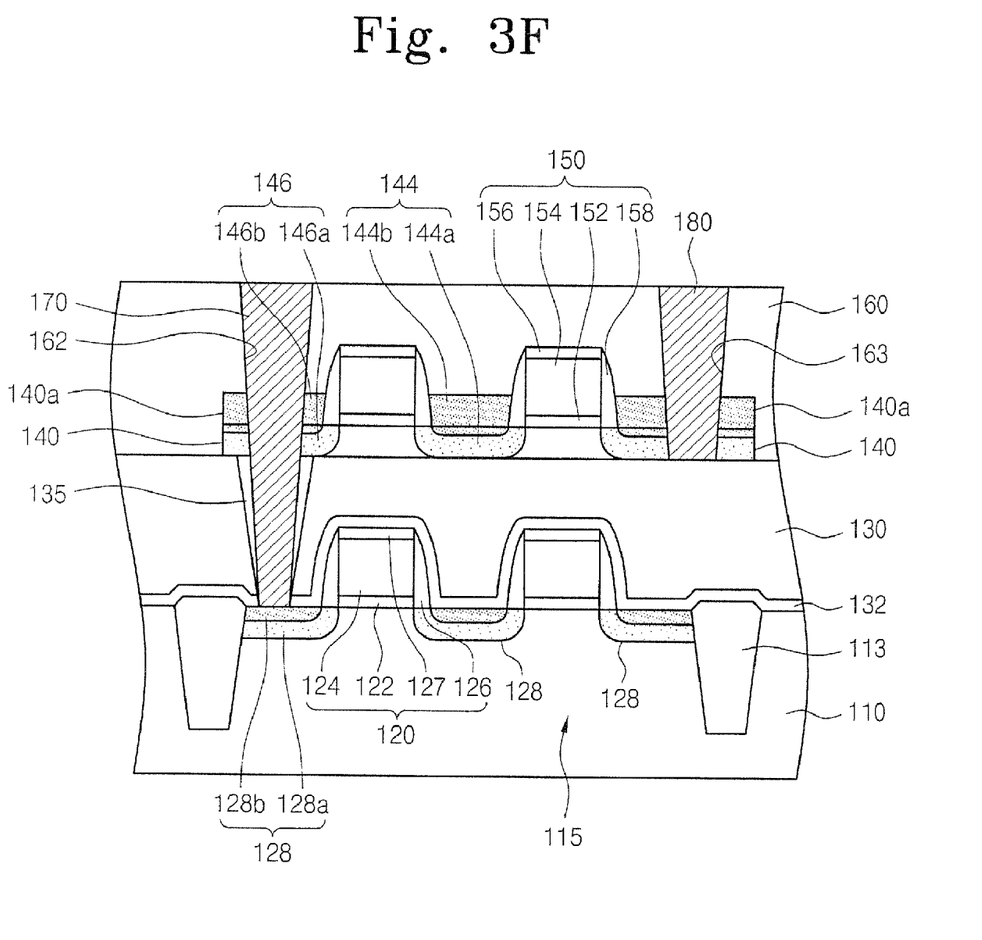

Referring to FIG. 3F, a second interlayer insulation layer 160 is formed to cover the second transistors 150 on the second semiconductor layer 140. The second interlayer insulation layer 160 may include a material such as, for example, silicon oxide formed using a HDP process, a BPSG process, or a PE-TEOS process. The second interlayer insulation layer 160 also may be planarized to facilitate transistor stacking.

As illustrated, the second interlayer insulation layer 160, the elevated layer 140a, the second semiconductor layer 140 and the epitaxial seed plug 135 are patterned using a photoresist pattern (not shown) to form first contact hole 162 exposing at least one of the source/drain regions 128 on the first semiconductor layer 110. Although not shown, a portion of the first interlayer insulation 130 may also be removed. A first conducting column 170 is formed to fill the first contact hole 162. The first semiconductor layer 110 is electrically connected to the second semiconductor layer 140 through the first conducting column 170. The side of the first conducting column 170 contacts the elevated layer 140a and the second semiconductor layer 140. The first conducting column 170 may include a barrier layer (e.g., a barrier metal layer) and a conductor material (e.g., a metal material) surrounded by a barrier layer. The barrier layer may include a material such as, for example, titanium or titanium nitride, and the conductor material may include a material such as, for example, tungsten.

Additionally, a second conducting column 180 is shown to penetrate the second interlayer insulation layer 160 to connect to the source region 144 or the drain region 146 in the elevated layer 140a. The lower portion of the second conducting column 180 contacts the elevated layer 140a and the second semiconductor layer 140. A second contact hole 163 is formed through the second interlayer insulation layer 160 to expose a source region or a drain region in the elevated layer 140a and a conductive material is deposited to fill the second contact hole 163 to form the second conducting column 180. The second conductive column 180 may include a barrier layer (e.g., a barrier metal layer) and a conductor material (e.g., a metal material) surrounded by a barrier layer. The barrier layer may include a material such as, for example, titanium or titanium nitride, and the conductor material may include a material such as, for example, tungsten.

It will be appreciated that the semiconductor device described above, and the methods of fabricating the same, may be applied in various memory devices. For example, the semiconductor device described above may be applied to a DRAM, a non-volatile memory including a gate electrode having a charge trap layer or a floating gate electrode, or a SRAM. When the semiconductor device is an SRAM device, exemplary applications of the semiconductor device described above are described with reference to FIGS. 4A and 4B. Like reference numerals refer to like parts throughout the various figures unless otherwise specified.

Figure 4A:
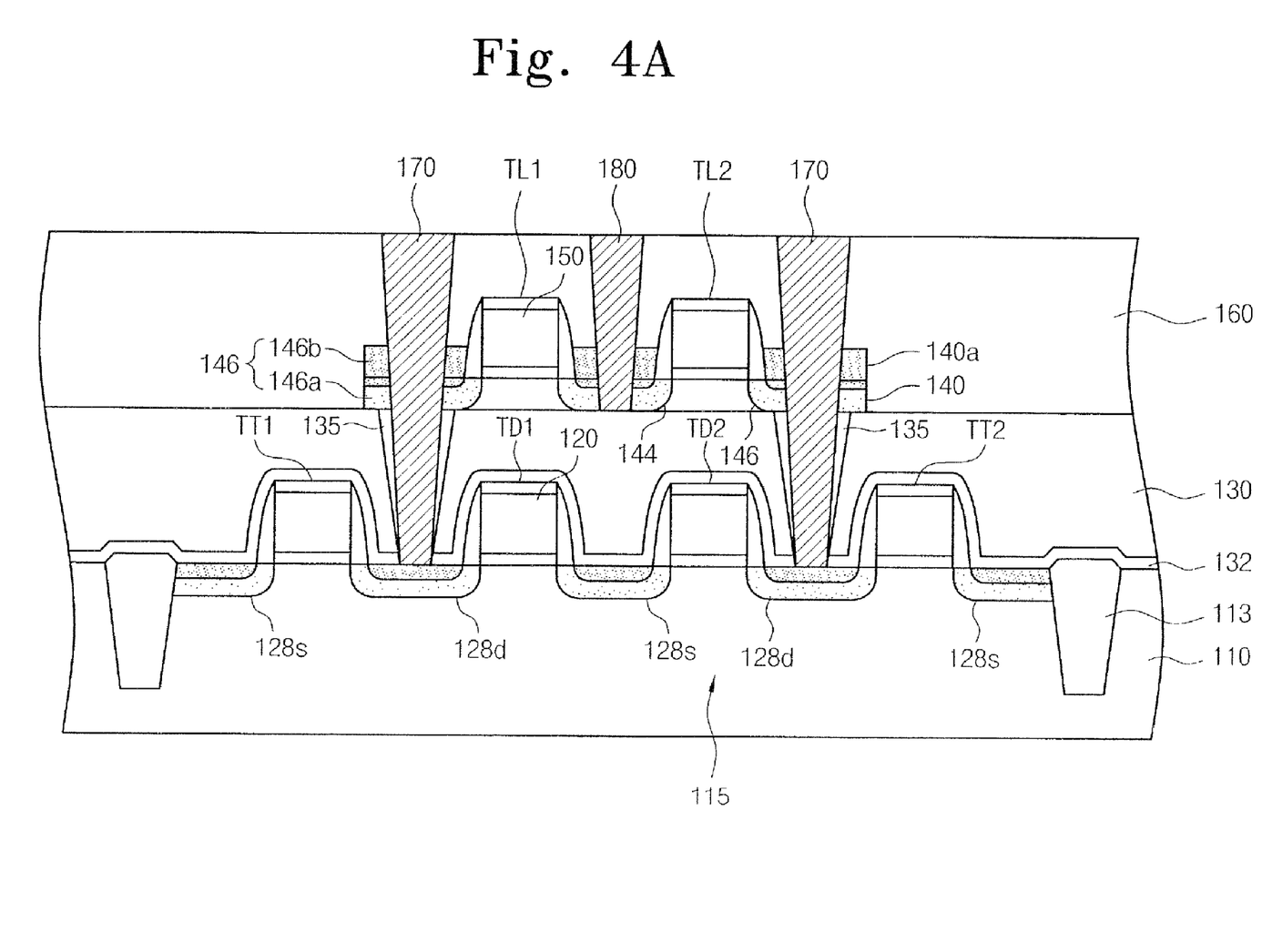
FIGS. 4A and 4B are sectional views of exemplary applications of the semiconductor device described with respect to FIGS. 2 and 3A through 3F.

Referring to FIG. 3F and 4A, four first transistors 120 may be formed on a semiconductor substrate 10. Two peripherally-arranged first transistors 120 are transfer transistors TT1 and TT2 of the SRAM device. Two centrally-arranged first transistors 120 are drive transistors TD1 and TD2. Source regions 128s located at both sides of the transfer transistor TT1 and TT2 are connected to bit lines (not shown). The second transistors 150 are load transistors TL1 and TL2 of the SRAM device. Drain regions 146 on the both sides of the load transistors TL1 and TL2 are connected to respective ones of the drain regions 128d of the transfer transistors TT1 and TT2 by respective ones of first conducting columns 170. The source region 144 between the load transistors TL1 and TL2 is connected to a power line (not shown) by second conducting column 180. The source region 128s located between the drive transistors TD1 and TD2 is grounded.

The number and/or position of first and second conducting columns 170 and 180 shown in FIG. 4A are different from that shown in FIG. 3F. Nevertheless, the first and second conducting columns 170 and 180 shown in FIG. 4A can be formed according to the same methods as described above with respect to FIG. 3F. Moreover, the source/drain regions 128s and 128d can be formed according to the same method as described above with respect to FIG. 3A.

Figure 4B:
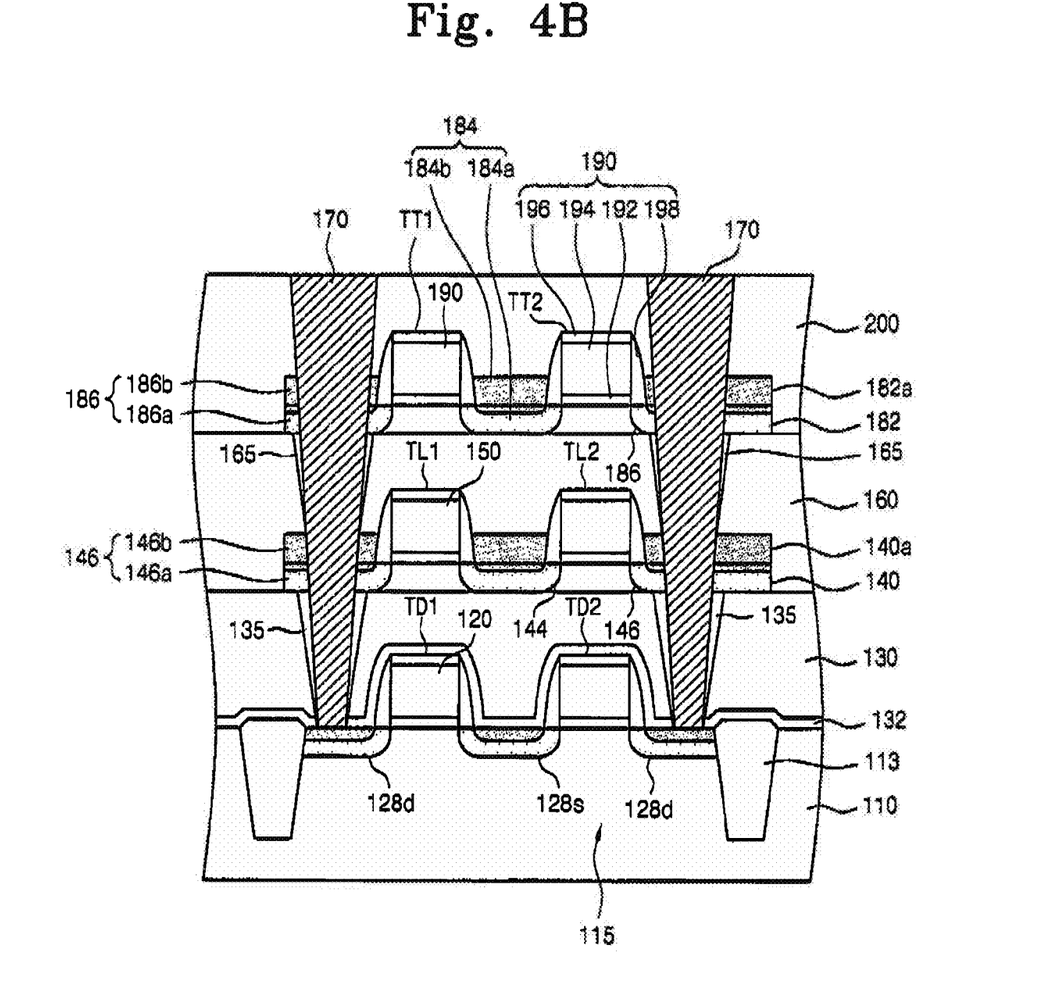

Referring to FIGS. 3F and 4B, third transistors 190 may be formed on the second interlayer insulation layer 160 and a third semiconductor layer 182 may be formed on the third transistors 190 and on the second insulation layer 160. In the illustrated embodiment, the third transistor 190 includes a gate insulation layer 192, a gate electrode 194, a capping pattern 196, and third sidewall spacers 198. An elevated layer 182a (i.e., a second elevated layer) is additionally formed on source/drain regions 184 and 186 of the third semiconductor layer 182. The third semiconductor layer 182, the elevated layer 182a, and the third transistors 190 may be formed in the same manner as the second semiconductor layer 140, the elevated layer 140a and the second transistors 140 are formed, a detailed description of their formation will be omitted. As shown in FIG. 4B, an epitaxial seed plug 165 may be grown from the elevated layer 140a of the second semiconductor layer 140 using a SEG method. As similarly described above, the epitaxial seed plug 165 may be as a seed to form the third semiconductor layer 180.

The first transistors 120 may be provided as drive transistors TD1 and TD2, the second transistors 150 may be provided as load transistors TL1 and TL2, and the third transistors 190 may be provided as transfer transistors TT1 and TT2. A third interlayer insulation layer 200 is formed to cover the third transistors 190 on the third semiconductor layer 180. The third interlayer insulation layer 200, the third semiconductor layer 180, the elevated layer 182a, the second interlayer insulation layer 160, the elevated layer 140a, the second semiconductor layer 140 and the first interlayer insulation layer 130 may be patterned using a photoresist pattern (not shown) to form contact holes exposing the drain regions 128d of the first semiconductor layer 110. Additionally, conducting columns 170 may be formed to fill the contact holes. The drain regions 128d, 146 and 186 of the first semiconductor layer 110, the second semiconductor layer 140 and the third semiconductor layer 180, respectively, may be electrically connected to each other by corresponding ones of the conducting columns 170. Side portions of the conducting columns 170 contact the second semiconductor layer 140, the elevated layer 140a, the third semiconductor layer 180, and the elevated layer 182a. As shown in FIG. 4B, the number of first conducting columns 170 is different from that shown in FIG. 3F. Nevertheless, the first conducting columns 170 shown in FIG. 4B can be formed according to the same methods as described above with respect to FIG. 3F. Moreover, the source/drain regions 128s and 128d can be formed according to the same method as described above with respect to FIG. 3A.

According to the embodiments exemplarily described above, an elevated layer that is self-aligned with respect to a sidewall spacer may be formed on source/drain regions without the need for additional patterning or photolithography processes. Accordingly, a leakage current can be reduced by decreasing the thickness of the channel region of the transistors while an electrical contact resistance can be reduced by increasing the contact area between the source/drain regions and a corresponding conducting column.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device, comprising:
 a first semiconductor layer;
 a first interlayer insulation layer covering the first semiconductor layer;
 a second semiconductor layer on the first interlayer insulation layer, the second semiconductor layer comprising a source region, a drain region and a channel region between the source and drain regions;
 a gate pattern on the channel region; and
 a conducting column extending through at least one of the source and drain regions,
 wherein at least one of the source and drain regions comprises a low-concentration impurity region and an elevated high-concentration impurity region, wherein a top surface of the elevated high-concentration impurity region is above a top surface of the channel region, and
 wherein at least a portion of a sidewall of each of the low-concentration impurity region and the elevated high-concentration impurity region contacts a side portion of the conducting column.

2. The semiconductor device of claim 1, wherein the top surface of the elevated high-concentration impurity region and at least a portion of a side surface of the elevated high-concentration impurity region are above a top surface of the channel region.

3. The semiconductor device of claim 1, wherein the gate pattern is over the channel region.

4. The semiconductor device of claim 1, wherein the low-concentration impurity region is between the elevated high-concentration impurity region and the first interlayer insulation layer.

5. The semiconductor device of claim 1, wherein the source and drain regions and the elevated high-concentration impurity region comprise an impurity of the same conductivity-type.

6. The semiconductor device of claim 5, wherein the elevated high-concentration impurity region is separated from a bottom portion of the second semiconductor layer.

7. The semiconductor device of claim 1, further comprising a sidewall spacer on a sidewall of the gate pattern, wherein the elevated high-concentration impurity region is self-aligned with respect to the sidewall spacer.

8. The semiconductor device of claim 7, further comprising a capping pattern on the gate pattern.

9. The semiconductor device of claim 8, wherein a crystal structure of the elevated high-concentration impurity region corresponds to a crystal structure of the second semiconductor layer.

10. The semiconductor device of claim 1, the conducting column further comprising a first conducting column extending through the first interlayer insulation layer and the second semiconductor layer, wherein the first conducting column electrically connects the first semiconductor layer and the second semiconductor layer together.

11. The semiconductor device of claim 10, further comprising:
 a second interlayer insulation layer covering the second semiconductor layer,
 wherein the conducting column comprises a second conducting column extending through the second interlayer insulation layer.

12. The semiconductor device of claim 11, wherein the first and second conducting columns comprise a barrier layer and a conductor material surrounded by the barrier layer.

13. The semiconductor device of claim 11, wherein a bottom portion of the second conducting column contacts the first interlayer insulation layer.

* * * * *